United States Patent [19]

Betker

[11] Patent Number: 4,938,279

[45] Date of Patent: Jul. 3, 1990

[54] FLEXIBLE MEMBRANE HEAT SINK

[75] Inventor: Jay B. Betker, Fullerton, Calif.

[73] Assignee: Hughes Aircraft Company, Calif.

[21] Appl. No.: 359,068

[22] Filed: Aug. 1, 1989

Related U.S. Application Data

[63] Continuation of Ser. No. 152,683, Feb. 5, 1988, abandoned.

[51] Int. Cl.⁵ .......................................... H01L 23/473
[52] U.S. Cl. .................................... 165/46; 165/80.4; 165/96; 165/104.33; 361/385
[58] Field of Search .................. 165/46, 80.4, 80.5, 165/96, 104.33; 357/82; 361/385, 384

[56] References Cited

U.S. PATENT DOCUMENTS

| | | | |
|---|---|---|---|
| 2,254,406 | 9/1941 | Zarotschenzeff | 165/46 X |
| 4,009,423 | 2/1977 | Wilson | 165/46 X |
| 4,020,399 | 4/1977 | Suzuki et al. | 357/82 X |
| 4,092,697 | 5/1978 | Spaight | 357/81 X |
| 4,109,707 | 8/1978 | Wilsons et al. | 165/46 |
| 4,309,592 | 1/1982 | Le Boeuf | 165/46 X |
| 4,323,914 | 4/1982 | Berndlmaier et al. | 357/70 X |
| 4,381,032 | 4/1983 | Cutchaw | 165/46 |
| 4,447,842 | 5/1984 | Berg | 357/82 X |
| 4,612,978 | 9/1986 | Cutchaw | 165/46 X |
| 4,740,866 | 4/1988 | Kajiwara et al. | 165/80.4 X |

FOREIGN PATENT DOCUMENTS

| | | | |
|---|---|---|---|
| 1494151 | 6/1966 | France | 165/46 |
| 0220954 | 11/1985 | Japan | 357/82 |
| 1368465 | 9/1974 | United Kingdom | 165/46 |

OTHER PUBLICATIONS

H. B. Parsapour, "Convection Cooling in Small Terminals", Jul. 1981, vol. 24, No. 2, p. 1222.

IBM Tech. Disclosure Bulletin, Aichelmann, Jr. et al., vol. 20, No. 11A, Apr. 1978, "Three Dim. MLC Substrate I.C. Support Package", pp. 4349-4350.

Primary Examiner—Albert W. Davis, Jr.
Attorney, Agent, or Firm—Wanda K. Denson-Low

[57] ABSTRACT

An expandable and contractable sealed environment is provided by a rigid frame member and a pair of deformable heat transfer elements fixed to the frame member. The frame member is located between two heat-producing electronic assemblies. A coolant agent is pumped into the sealed environment to flex the membranes and cause them to conformally contact the pair of electronic assemblies. Excess heat in the assemblies is then allowed to pass across the membranes and into the coolant agent for dissipation purposes. In order to remove the electronic assemblies, the pressure of the coolant agent is reduced, which permits the heat transfer element to return to its nondeformed state removed from the assembly. Thus, the electronic assemblies can be removed without the need to open fluid couplings.

5 Claims, 2 Drawing Sheets

FLEXIBLE MEMBRANE HEAT SINK

CROSS-REFERENCE

This application is a continuation of my prior application Ser. No. 152,683, filed Feb. 5, 1988, now abandoned.

BACKGROUND OF THE INVENTION

1. Field of the Invention

The present invention relates generally to heat sinks and, more particularly, to an improved method for externally lowering the operational temperature of an electronic assembly and apparatus for accomplishing the same.

2. Description of Related Art

A past design practice for cooling an electronic assembly has been to directly plumb coolant into the assembly. Thereby, coolant is either statically held in reservoirs throughout the assembly or pumped through coolant channels in the assembly. Another past practice has been to provide coolant plates to which the electronic assembly is fastened. The coolant plates typically include fin elements along which the coolant passes.

In the context of integrated circuits, artisans have utilized an organic film to enclose a thermally conductive liquid of a fixed amount. The film and fixed amount of liquid are contained in a cover which encloses the chip. Thereby, a conformable heat radiator contacts the chip. This is shown, for example, in U.S. Pat. Nos. 4,323,914 and 4,092,697.

In a similar fashion, a rigid housing with a thin-wall diaphragm has been provided to enclose a coolant chamber which is securely fastened to a base which holds an integrated circuit package. Elastomeric strips are then used to bias the diaphragm and thermally conductive disks contact the individual dice in the package. This is shown in U.S. Pat. No. 4,381,032.

Each of the above approaches, however, has limitations which lessen performance. Direct plumbing requires fluid couplings for electronic assembly removal and replacement. To reduce electronic assembly removal time for servicing, direct plumbing designs have required the use of quick disconnect fittings. While generally satisfactory connections can be accomplished with these fittings, they have the drawbacks of being expensive and allowing fluid leakage with each connection or disconnection.

Fixed coolant plates have their drawbacks. They create the need for a high degree of flatness and stiffness within the plates themselves and within the electronic assemblies for consistent and predictable thermal performance. Yet, the flatness requirement creates a situation where many high rate production processes are no longer feasible. Hence, the coolant plates and the electronic assembly chassis become very costly.

Enclosed liquid chambers that are fastened to a support to surround the assembly prevent easy assembly, removal and insertion. Removal or insertion of an electronic assembly requires removal and reattachment of the coolant chamber to the support.

A need still exists in the art to provide a heat sink that is low in cost, eliminates the need for couplings, and dissipates heat in an efficient manner.

SUMMARY OF THE INVENTION

An object of the invention is to provide a flexible membrane heat sink to dissipate heat from various types of heat sources.

Another object of the present invention is to provide a heat sink which eliminates the need for fluid couplings to the heat source itself.

An additional object of the present invention is to provide a heat sink that allows heat-producing assemblies to be removed from and reinserted to a support without having to remove, disconnect, or reinsert the heat sink.

A further object of the present invention is to provide an apparatus and method for lowering the operational temperature of electronic assemblies in a consistent and predictable fashion.

An even further object of the present invention is to provide an improved method and apparatus for lowering the temperature of electronic assemblies by providing a conformal fit between the heat sink and the walls of the electronic assemblies.

Yet another object of the present invention is to provide a heat sink that is light in weight, but attenuates shock and vibration between adjacent electronic assemblies.

The objects of the present invention are accomplished by providing at least one deformable heat transfer element adjacent each electronic assembly. When dissipating heat, the heat transfer element is in contact with the electronic assembly. When not dissipating heat, the heat transfer element may be removed from contact with the electronic assembly. In both cases, each heat transfer element remains detached from each electronic assembly to enable each electronic assembly to be removed from a support, although the heat transfer element may first have to be removed from contact. A coolant reservoir is placed in contact with each heat transfer element and the size of the coolant reservoir can be altered. The alterable coolant reservoir is utilized to deform each heat transfer element and thereby place it in contact with at least one thermal communication area adjacent each electronic assembly.

Also, the objects of the present invention are accomplished by providing a rigid frame member which is fixed in position between a pair of electronic assemblies and which describes a reservoir space. An inlet member and an outlet member interface the reservoir space. A first membrane is fixed on the frame member to enclose a portion of the reservoir space, and is capable of being flexed in a first direction away from the frame member and in an amount that is less than the yield point of the first membrane. A second membrane is also fixed on the frame member to enclose another portion of the reservoir space, and is capable of being flexed in a second direction that is opposite the first direction and in an amount that is less than the yield point of the second membrane.

Further features, advantages, and objects of the present invention can be better understood from an examination of the following detailed description taken in conjunction with the accompanying drawings, in which:

DESCRIPTION OF THE PREFERRED EMBODIMENTS

The following description is provided to enable any person skilled in the art to which the present invention pertains, or with which it is most nearly connected, to make and use the present invention and sets forth the best mode contemplated by the inventor of carrying out his invention. Various modifications, however, may become apparent to those skilled in the art, and the present invention includes those modifications unless limited by the claims hereto.

Figure 1:
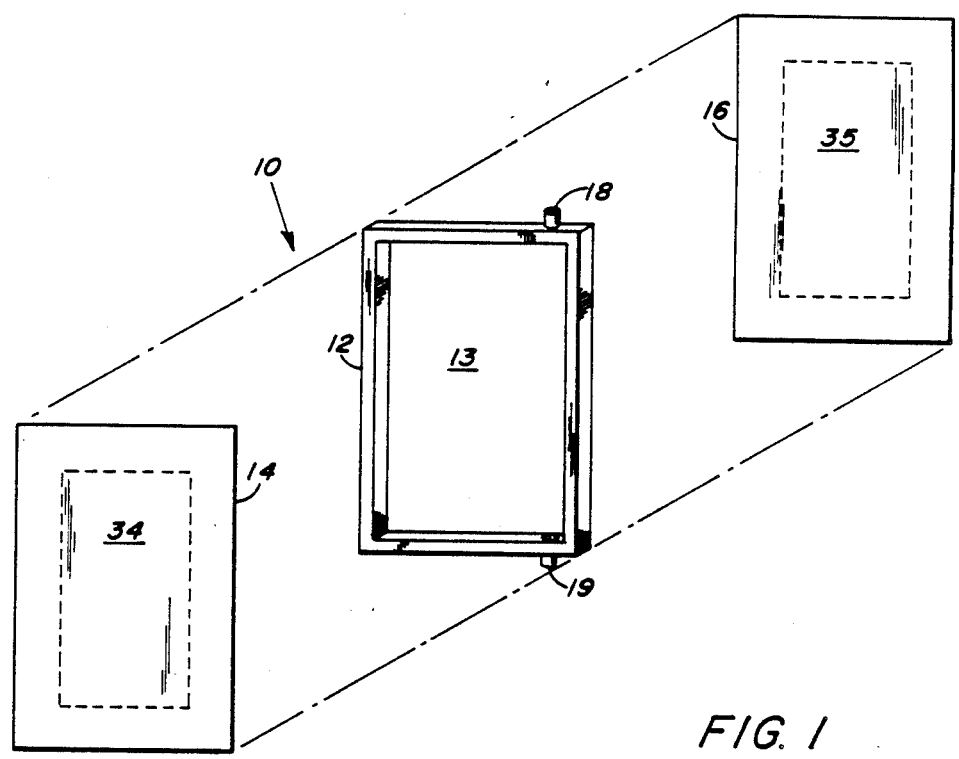
FIG. 1 is an exploded, perspective view of a heat sink assembly according to the present invention.
Figure 2:
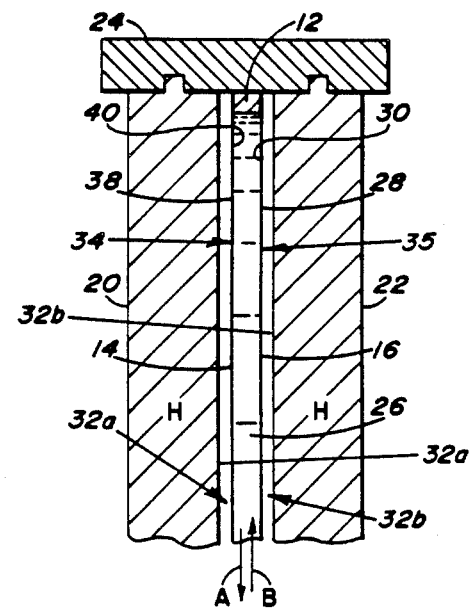
FIG. 2 is a partial, cross-sectional view of a heat sink assembly in accordance with the present invention in a nonexpanded state, while located in between adjacent electronic assemblies.

FIG. 1 shows a heat sink assembly 10 according to the present invention which defines a variably-sized sealed environment. FIG. 2 shows the heat sink assembly 10 positioned between two heat-producing assemblies 20, 22. The assemblies 20, 22 are referred to herein as electronic assemblies which, for example, may be amplifiers. However, these assemblies may be other than electronic, although, as used for illustrative purposes herein, they produce significant heat during operation and require the heat to be dissipated for proper operation. However, it should be noted that the expressions "electronic assemblies" and "assemblies" are used herein for convenience of description only, and, in fact, refer to any heat source to which the invention may be applied. In this embodiment, the heat-producing assemblies 20, 22 as well as the heat sink assembly 10, are stationarily fixed to a support structure 24. Other means for supporting the assemblies 20, 22 and the heat sink 10 may also be employed.

The heat sink assembly 10 includes a rigid frame member 12. The frame member 12 surrounds and thereby describes a reservoir space 13. Further, the frame member 12 provides an amount of rigidity to the sealed environment to permit controlled placement of the sealed environment between the electronic assemblies 20, 22. As further described below, the sealed environment also includes a first membrane 14 and a second membrane 16, both of which complete the enclosure of the reservoir space 13.

In this particular embodiment, the frame member 12 is rectangular shaped. However, the frame member 12 may be appropriately altered in configuration and dimension to meet the specific spatial arrangement in which it is placed, as will be evident from the description below. Preferably, the frame member 12 is constructed of a fluid corrosion-resistant material, such as stainless steel, aluminum, or copper that can be stamped, cast, or machined. Plastics are also contemplated for construction of the frame member 12, which may be formed by injection molding.

An inlet member 18 is fixed in a top portion of the frame member 12 in the view of FIG. 1. However, the inlet member 18 can be placed at other points in the frame member 12 to accommodate the spatial arrangement of the electronic assemblies 20, 22 to each other and to the support 24. The inlet member 18 provides a fluid communication path between the reservoir space 13 and a fluid coolant agent source (not shown) located at a position removed from the reservoir space 13. Thereby, a fluid coolant agent, being of any appropriate conventional composition, such as meg-ohm water or ethylene glycol, may be pumped into the sealed environment.

Similarly, an outlet member 19 is fixed in the lower portion of the frame member 12, in the view of FIG. 1, to enable the coolant agent to exit from the reservoir space 13. Again, the outlet member 19 may be placed other than in the lower portion of the frame member 12 to accommodate spatial requirements.

A deformable first membrane or heat transfer element 14, which is configured and dimensioned like the frame member 12, includes a planar exterior side 38 and a planar interior side 40. The membrane 14 is stationarily affixed along its peripheral edge to a side of the frame member 12 in any appropriate conventional fashion, such as by edge welding or brazing. So fixed, the exterior side 38 interfaces the electronic assembly 20 and the interior side 40 interfaces the reservoir space 13. The membrane 14 thus closes off a side of the reservoir space 113 and forms another part of the sealed environment.

In this environment, the first membrane 14 is a thin metallic element made of a fluid corrosion resistant material such as metal, including stainless steel, aluminum, or copper. Preferably, stainless steel is used which can withstand upwards of 10,000 to 20,000 psi and provides on a side thereof, which interfaces the assembly, a thermal impedance during operation of up to around 2° C.-in.$^2$/watt. On the other side thereof that interfaces the reservoir space 13, a thermal impedance of up to around 500–700 btu/hr./ft$^2$/°F. is provided. While the present invention contemplates other thicknesses which are dependent upon the specific material out of which the membrane 14 is constructed, the first membrane 14 preferably has a thickness which is between about 0.005 to 0.020 inches when using stainless steel. As a result of its construction, the first membrane 14 can be flexed or deformed away from the frame member 12 when the coolant agent is pumped into the reservoir space 13 (FIG. 3), as will be further described below. The amount by which the first membrane 14 is flexed is defined by its Yield point. The yield point is that amount of flexure that can be sustained by the membrane 14 while remaining capable of returning to its nonflexed or nondeformed state (FIG. 2) upon the removal of the pressure or force causing the flexure. As is well known, an element will return, after being flexed, to its resting configuration as a result of its "memory" or internal elastic forces.

Figure 3:
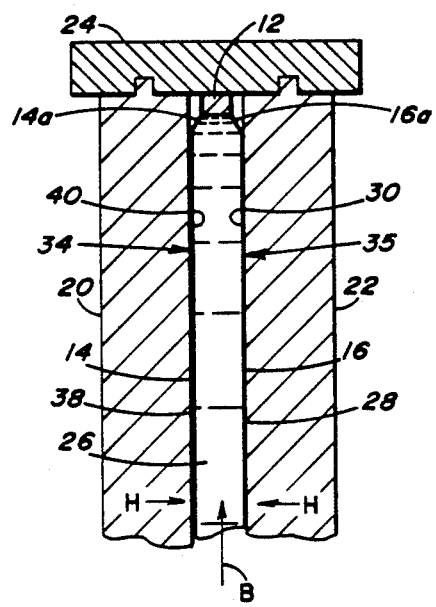
FIG. 3 is a partial, cross-sectional view of an embodiment of the present invention in an expanded state, while located in between adjacent electronic assemblies.

A first heat transfer area 34 is provided by a portion of the first membrane 14 to transfer excess heat H from the electronic assembly 20 and into the heat sink 10 (FIG. 3). More specifically, the heat transfer area 34 is that portion of the membrane 14 that intimately contacts the electronic assembly 20 during heat dissipation. As seen by the phantom lines in FIG. 1, the heat transfer area 34 is, in this particular embodiment, generally rectangular in configuration and is of a dimension slightly less than the rectangular perimeter of the reservoir space 13. The difference in dimension is due to a transition area 14a in the membrane 14 that extends from the frame member 12 to the heat transfer area 34 (FIG. 3). As can be seen, the transition area 14a does not contact the electronic assembly 20 and results in a reduced overall effective heat transfer area of the membrane 14.

A deformable second membrane or heat transfer element 16 is fixed along its peripheral edge to a side of the frame member 12 opposite the first membrane 14. The second membrane 16 is configured, dimensioned, and constructed like the first membrane 14 and closes off another side of the reservoir space 13. Also like the first membrane 14, the second membrane 16 has a planar exterior side 28 that interfaces the electronic assembly 22 and a planar interior side 30 that interfaces the reservoir space 13.

Additionally, the second membrane 16 provides a transition area 16a and heat transfer area 35 which are configured and dimensioned like the transition area 14a and the heat transfer area 34, respectively, of the first membrane 14. As with the first membrane 14, the second membrane 16 can be flexed or deformed up to its yield point to intimately contact the electronic assembly 22 upon the coolant agent being pumped into the reservoir space 13. It can be appreciated that the frame member 12 and the membranes 14, 16 combine to provide a sealed environment that can expand upon the introduction of the coolant agent and can contract upon the exit of the coolant agent.

While the above preferred embodiment includes two flexible membranes for cooling two assemblies, the present invention further contemplates, in a different embodiment, the use of a single flexible membrane for cooling a single heat-producing assembly. In such a case, a nonflexible member is substituted for one of the flexible membranes and the other flexible membrane remains adjacent the single heat-producing assembly. Thus, upon pumping the coolant agent into the reservoir space 13, the flexible membrane can be flexed and thereby cause its heat transfer area to contact the assembly.

Additionally, a further embodiment of the present invention includes a first membrane 14 which is configured and dimensioned differently from the second membrane 16. In the event that the assemblies 20, 22 are dissimilar, each membrane 14, 16 may be appropriately altered to meet the particular configuration and dimension of the respective heat-producing assembly 20, 22.

As noted above, during its operation and nonoperation, the heat sink assembly 10 is stationarily fixed intermediate of the pair of electronic assemblies 20, 22, as shown in FIGS. 2 and 3. FIG. 2 depicts the heat sink assembly 10 in its nonoperational or nonexpanded state.

The arrows A and B in FIG. 2 depict an equivalent coolant flow out of and into the heat sink 10, respectively. Thereby, a coolant reservoir 26 of a coolant agent is created in the heat sink 10. Since there is no net flow, the size of coolant reservoir 26 and thus the size of the sealed environment, remain static. The invention further contemplates that, in the nonexpanded state, no coolant agent is in the reservoir space 13. In either event, while the heat sink assembly 10 is in its nonexpanded state, the membranes 14, 16 are positioned outside of two thermal communication areas 32a,b.

The thermal communication area 32a is that area extending between the heat transfer area 34 and the assembly 20 and immediately adjacent such assembly 20. The thermal communication area 32b is likewise that area extending between the heat transfer area 35 and the assembly 22 and immediately adjacent such assembly 22. When the heat transfer areas 34, 35 are outside of the thermal communication areas 32a,b, heat H produced by the electronic assemblies 20, 22 is not being removed.

To remove the heat H, the heat sink 10 is transformed into an expanded state, as shown in FIG. 3. In its expanded state, the coolant agent is being pumped into the heat sink 10 at a rate that is faster than that which the coolant exits to provide a net inflow of the coolant agent as shown by arrow B. The coolant reservoir 26 consequently expands and deflects the membranes 14, 16 towards the electronic assemblies 20, 22, respectively. Thereby, the membranes 14, 16 enter the thermal communication areas 32a,b. More specifically, the heat transfer areas 34, 35 of the membranes 14, 16 intimately contact respective assemblies 20, 22 to enable the heat H to transfer from the assemblies and into the coolant reservoir 26. During contact of the assemblies, the heat transfer areas 34, 35 exert a generally equivalent amount of pressure at all points of contact with the assemblies 20, 22. Consequently, the ability to cool relatively high thermal densities is increased. Further, the possibilities of the assemblies 20, 22 being forced out of their required operating positions by the pressure contact from the membranes are minimized because generally even pressure along the surface of the assemblies is provided which minimizes extreme point forces.

FIGS. 2 and 3 depict the assemblies 20, 22 as having straight, exterior surfaces that contact the membranes 14, 16. Still, the present invention is adaptable to a surface that has a curvature along the entire run of the surface. The membranes 14, 16, when flexed, conform to the curved configuration of the assembly surfaces and still achieve even pressure contact. Examples of other irregular surface configurations on the assemblies are shown in FIGS. 4–6.

Figure 4:
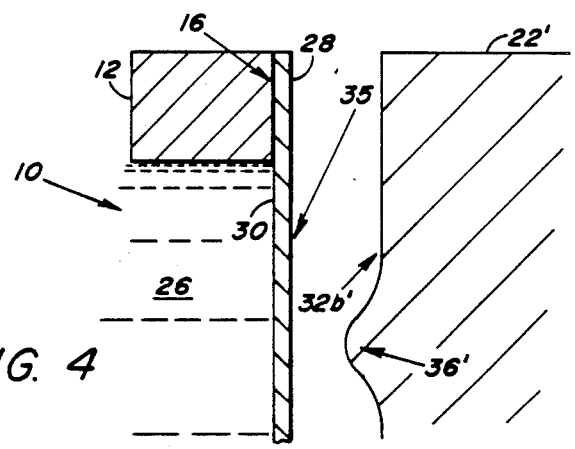
FIG. 4 is a partial, cross-sectional view of an embodiment of the present invention in a nonexpanded state adjacent a first type of irregular shaped electronic assembly.

FIG. 4 depicts the nonexpanded heat sink assembly 10 adjacent an electronic assembly 22'. The assembly 22' is like the assembly 22 but with the former having a protrusion 36' at an exterior side that interfaces the membrane 16. The protrusion 36' represents an abnormality in the otherwise planar surface of the assembly 22' or perhaps an area made specifically different from the surrounding area to accommodate particular equipment in the assembly 22'. The protrusion 36' is not normally so large that membrane 16 goes past its yield point.

Figure 5:
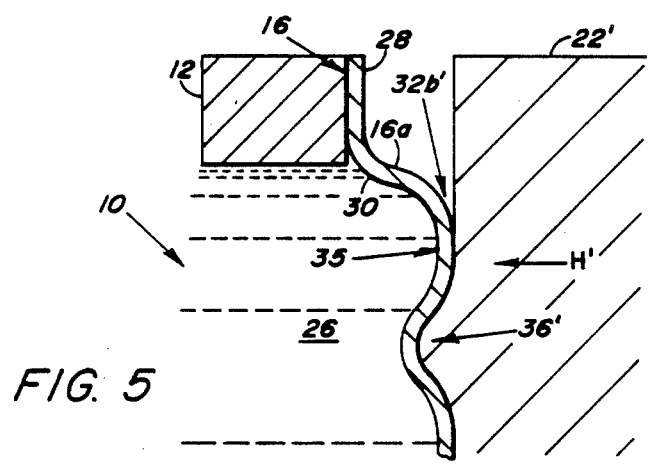
FIG. 5 is a partial, cross-sectional view of an embodiment of the present invention in an expanded state adjacent the first type of irregular shaped electronic assembly.

FIG. 5 relates to FIG. 4 and depicts an expansion of the coolant reservoir 26 to flex the membrane 16. Thereby, the heat transfer area 35 moves into the thermal communication area 32b' and contacts the assembly 22'. Concurrently, the heat transfer area 35 conforms to the contour of the assembly 22' including the protrusion 36' therein. As above, the membrane 16 provides a substantially equivalent amount of pressure along the heat transfer area 35 which contacts the assembly 22'.

Figure 6:
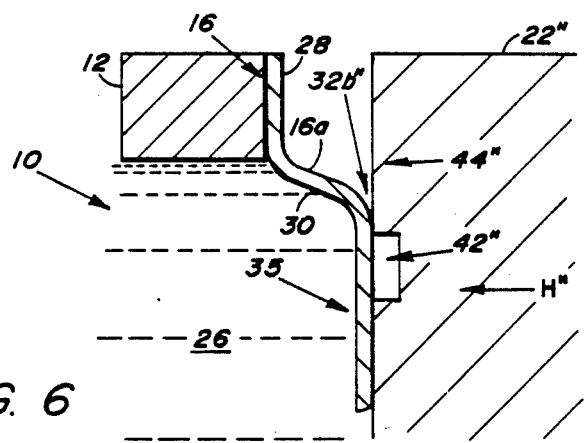
FIG. 6 is a partial, cross-sectional view of an embodiment of the present invention in an expanded state adjacent another type of irregular shaped electronic assembly.

FIG. 6 depicts another nonplanar surface of an assembly 22". The surface includes alternating plateau areas 44" and depression areas 42". This surface configuration may exist, for example, to provide greater structural strength to the assembly 22". As seen in FIG. 6, the heat transfer area 35 contacts the plateau areas 44" but remains outside of the depression areas 42". Nevertheless, the pressure exerted on the plateau areas 44" are generally equivalent which, in the aggregate, provides a generally even amount of pressure over the entire exterior surface of the assembly 22".

It can be appreciated from the above that by reducing the thickness of the membranes 14, 16, using a more flexible material for the membrane, or increasing the flow of coolant agent, the ability of the membranes 14, 16 to conform to more severe irregularities in the surface of the contacted assembly increases.

In operation, a series of heat sink assemblies 10 may be alternated with a series of heat-producing assemblies. Such an arrangement provides an equivalent amount of pressure exerted on each heat-producing assembly from opposite sides. If no further heat H is to be dissipated, or the assembly 20 must be removed from the support 24, the membranes 14, 16 are contracted back to their non-expanded state by discontinuing the flow of coolant agent into the heat sink assembly 10, or reducing the net flow in or increasing the net flow out of the reservoir 26. For removal, repair, or replacement of the assembly 20, it can be appreciated that the heat sink assembly 12 may remain fixed to the support 24 while still allowing the assembly 10 to be detached from the support 24.

As can be seen, the present invention eliminates excessive weight by eliminating an entire level of structural assembly, such as that present in flat, cold plates. Complexity associated with prior heat dissipation techniques is reduced because no physical fastening of the heat sink to the electronic assemblies is required. Coolant lines need not be disconnected and reconnected each time an assembly must be replaced or repaired. This results in a minimization of coolant agent leakage and thus potential corrosion and damage to the heat sink assembly itself and to the heat-producing assemblies The present heat sink also attenuates shock and vibration of the electronic assemblies. Due to the flexibility of the membranes 14, 16 and the compressibility of the reservoir 26 from external forces, the present heat sink assembly tends to serve as a cushion between the heat-producing assemblies. Thus, when the support 24, for example, is vibrated, the otherwise resulting vibration to the heat-producing assemblies is lessened. Additionally, the present invention allows for an increase in packaging efficiency because of greater stacking capability of electronic assemblies. Unlike certain prior art designs, the present invention eliminates the need for fastening devices to fasten the heat sink to the assembly. By eliminating the need for fastening devices, the space required to allow an operator to fasten or remove such devices to work on heat-producing assemblies is eliminated.

The specifications above describe only certain preferred embodiments of the present invention, and it is contemplated that various modifications to the above can be effected but nevertheless come within the scope of the present invention as defined by the claims. For example, while the above has described the embodiments of single and double membranes, further embodiments may include more than two membranes.

What is claimed is:

1. A heat sink assembly comprising:
   first and second heat producing assemblies, a support structure, said first and second heat-producing electronic assemblies being supported by said support structure to leave a space between said heat-producing electronic assemblies, said heat-producing electronic assemblies being demountably mounted with respect to said support structure, said heat sink assembly comprising:
   a rigid metallic frame, said frame having ends and walls to define a reservoir space therein and having first and second planar faces;
   first and second resilient metallic membranes being secured with their inner faces respectively against said first and second faces of said frame and sealed with respect thereto to enclose said reservoir space, said outer faces of said membranes being substantially planar when said reservoir is unpressurized, said assembly having a thickness between said first and second membrane outer faces less than the space between said spaced electronic assemblies so that said heat sink assembly can be placed between spaced electronic assemblies without contact thereon;
   a coolant fluid inlet connection to said reservoir in said heat sink assembly to permit coolant to flow into said reservoir and a coolant outflow connection from said reservoir spaced from said inlet connection to permit coolant fluid outflow from said reservoir; and
   control means for controlling coolant fluid flow and reservoir pressure to pressurize said reservoir to resiliently deflect said membranes into contact with the adjacent electronic assemblies and simultaneously cause coolant flow through said reservoir to extract heat therefrom so that said control means can be operated to depressurize said reservoir to permit resilient retraction of said membranes out of contact with the adjacent electronic assemblies to permit detachment of one of said electronic assemblies from said support structure and replacement thereof without removal of said heat sink assembly from its position adjacent the remaining electronic assembly.

2. The heat sink assembly of claim 1 wherein said frame and said membranes are made of a metal selected from the group consisting of stainless steel, aluminum and copper.

3. The heat sink assembly of claim 2 wherein each said membrane is attached to said frame by welding material.

4. The method of cooling spaced adjacent electronic assemblies comprising the steps of:
   placing between the spaced adjacent electronic assemblies an unpressurized heat sink having a rigid frame and first and second flexible membranes out of contact with the spaced electronic assemblies;
   simultaneously pressurizing the heat sink assembly with coolant fluid to resiliently deflect the first and second membranes on the heat sink assembly respectively into contact with the adjacent electronic assemblies and passing coolant through the heat sink assembly to withdraw heat from the heat sink assembly in the electronic assemblies with which the heat sink assembly is in physical and thermal contact;
   depressurizing the heat sink; and
   removing and replacing at least one of the adjacent electronic assemblies without removing the heat sink.

5. The method of cooling spaced adjacent electronic assemblies comprising the steps of:

placing between the spaced adjacent electronic assemblies an unpressurized heat sink having a rigid frame and first and second flexible membranes out of contact with the spaced electronic assemblies;

simultaneously pressurizing the heat sink assembly with coolant fluid to resiliently deflect the first and second membranes on the heat sink assembly respectively into contact with the adjacent electronic assemblies and passing coolant through the heat sink assembly to withdraw heat from the heat sink assembly in the electronic assemblies with which the heat sink assembly is in physical and thermal contact;

depressurizing the heat sink;

removing and replacing at least one of the adjacent electronic assemblies without removing the heat sink; and repressurizing the heat sink so that its membranes resiliently deflect into contact with the replaced electronic assembly to cool it.

* * * * *